United States Patent [19]

Bock et al.

[11] Patent Number: 4,869,926

[45] Date of Patent: Sep. 26, 1989

[54] METHOD OF PRODUCTION GALVANICALLY DEPOSITED ALUMINUM LAYERS FOR USE AS CONTACTS OF MICROCIRCUITS

[75] Inventors: Martin Bock; Detlef Tenbrink, both of Berlin, Fed. Rep. of Germany

[73] Assignee: Schering Aktiengesellschaft, Berlin and Bergkamen, Fed. Rep. of Germany

[21] Appl. No.: 27,491

[22] Filed: Mar. 17, 1987

[30] Foreign Application Priority Data

Mar. 21, 1986 [DE] Fed. Rep. of Germany ....... 3610036

[51] Int. Cl.$^4$ ............................................. B05D 5/12

[52] U.S. Cl. ..................................... 427/96; 204/38.4; 204/58.5; 357/67; 427/98; 437/194; 437/228; 437/230

[58] Field of Search ................ 204/38.4, 58.5; 427/96, 427/98; 437/194, 228, 230; 357/67

[56] References Cited

U.S. PATENT DOCUMENTS

| | | | |
|---|---|---|---|
| 3,890,636 | 6/1975 | Harada et al. | 357/68 |
| 3,940,785 | 2/1976 | Genesi | 357/15 X |
| 3,948,736 | 4/1976 | Russell | 204/15 |
| 4,433,004 | 2/1984 | Yonezawa et al. | 437/194 X |

Primary Examiner—Michael Lusignan
Attorney, Agent, or Firm—Michael J. Striker

[57] ABSTRACT

Contacts of microcircuits are produced by galvanically depositing aluminum layers on a substrate carrying a microcircuit.

5 Claims, No Drawings

METHOD OF PRODUCTION GALVANICALLY DEPOSITED ALUMINUM LAYERS FOR USE AS CONTACTS OF MICROCIRCUITS

BACKGROUND OF THE INVENTION

The present invention relates to the use of galvanically deposited aluminum layers for contacts of microcircuits.

The use of galvanically deposited aluminum layers produced of nonaqueous solutions under protection gas, for protection against corrosion has been known, for example from EP-PS No. 0,042,504.

Semiconductor structural components utilized in microelectronics are normally electrically connected to the base circuit by ultra-violet welding. Wire connections with which a suitable tool (key or capillary tube) welds the wire, with the aid of the ultraviolet radiation or the ultraviolet radiation and heat, to contact spots of the semiconductor-and-substrate circuit, and superposing contact methods with which the contact tabs of the intermediate carrier or support are welded with the aid of a suitable tool to the semiconductor and further to the base circuit are different.

For metallurgical and coatings-producing grounds an aluminum layer deposited on the side of the semiconductor penetrates its surface. Gold layers produced by metallizing, which are vaporized, are galvanically deposited or compressed as a paste. In addition, all the circuits nowadays are provided with contacts of aluminum or gold wire. This always leads to a material pair aluminum-gold either on the semiconductor with connections with gold wire or on the base circuit with connections with aluminum wire. This material pairs can, however, cause, due to the formation of intermetallic compounds a so-called purple plague or, due to a contact corrosion, a reduced reliability of the whole circuit.

SUMMARY OF THE INVENTION

It is an object of the present invention to provide an improved method of producing galvanically deposited aluminum layers for contacts of microcircuits.

It is another object of this invention to use the aluminum coating compatible with customary wire materials and welding methods for providing contacts of integrated circuits.

These and other objects of the invention are attained by a method of producing contacts of microcircuits comprising the step of galvanically depositing aluminum layers on a substrate carrying a microcircuit to use said layers as contacts of the microcircuit.

The aluminum layers coat a conductive metallic layer provided on said substrate and after said coating are etched with the use of a suitable resist.

The metallized or aluminum-coated spots according to the invention serve as contact spots for ultra-violet welding and are suitable for all customary wire materials.

It is particularly advantageous that in contrast to conventional gold coatings with the etching, no underetching due to contact corrosion takes place so that also thick aluminum layers are possible as contact layers whereby with connections with aluminum wire no purple plaque or contact corrosion can occur, and the coating is inexpensive as compared with that of gold.

A further advantage of the method of this invention resides in that a very inexpensive aluminum metallizing is also suitable for superposing contact methods.

The galvanically deposited aluminum layers according to the invention offer an effective protection for conductive paths of copper and are also well suited for reasonably priced high frequency circuits. The galvanic aluminum is not used with usual solders whereby a specific solderless layer for the application of a reflow soldering or wave heat soldering is provided which is very inexpensive. The connections with aluminum wire have a very good reliability. Also, connections with gold wire are produced without any problems.

The method of the invention may comprise the steps of producing a conductive metallic layer on the circuit substrate by a chemical metallizing, evaporation or cathode decomposition, then galvanically depositing on said metallic layer an aluminum layer and, after coating with a suitable resist, etching said aluminum layer.

A silicon substrate may be utilized, which after producing of microcircuit structures thereon is passivated outside contact spots and the latter are galvanically reinforced with aluminum.

The method may further comprise the step of providing an intermediate substrate with a galvanically deposited aluminum layer and then etching the same.

The method may comprise the steps of chemical metallizing of said substrate, then applying to said substrate a photo-structure polyamide layer, and then executing said aluminum depositing step only on connection pads and only at places where a solderless layer on conductive paths of said microcircuit is desired.

The objects of this invention are also attained by the use of galvanically deposited aluminum layers on a substrate carrying a microcircuit as contacts of said microcircuit.

The objects of this invention are further attained by a semiconductor produced by galvanically depositing on a substrate carrying a microcircuit of aluminum layers which serve as contacts of said microcircuit.

DETAILED DESCRIPTION OF THE PREFERRED EMBODIMENTS

A method of producing contacts of integrated circuits according to the invention resides in depositing by a galvanic process of aluminum layers on a substrate provided with conductive paths.

The following examples serve to clarify the method according to the invention.

EXAMPLE I

A circuit substrate of aluminum oxide is, after suitable pre-treatment and activation in an activator containing palladium ions, chemically copperplated and then galvanically aluminized. After the application of suitable resists, the aluminum on the solder spots is removed with thinned hydrochloric acid, the resist is dissolved and, after a repeated application of the resist, the conductive structures and the connection spots, also after the exposure and development, are shaped or structured in a further etching step. The provision of contacts on semiconductors is executed by ultra-violet welding with aluminum wire of 25 $\phi$ $\mu$m in diameter.

EXAMPLE II

A ceramic plate coated with tantalum and nickel by the cathode decomposition is galvanized with aluminum of 50 $\mu$m and is coated with an alkali-resistant resist, which is exposed and developed so that with the following etchspraying with a thinned black liquor-lye solution of bumps arised from aluminum, the arrangement on the plate would correspond to the mirror image of the connection spots of the semiconductor circuit. After the removal of the resist, the conductive-and-resistance structures would be produced with the aid of further photo-screening and etching steps and the semiconductor circuit would be welded directly to those structures by means of a special tool by ultra-violet welding.

EXAMPLE III

The connection spots on the disc of silicon with prepared structured circuits are galvanically reinforced with aluminum of 50 μm. The metallizing of the flexible intermediate substrate would be provided with 3 non-galvanically separated aluminum which would be then again etched at the outer region. After the etching of the conductive structure of the intermediate substrate the integrated circuit of the silicon disc would be welded in the inner region, with the application of the ultra-violet energy, and then the intermediate substrate would be soldered to the conductive plate.

EXAMPLE IV

A flexible intermediate substrate is galvanically coated with aluminum similarly to Example III and then its conductive structure is etched. Thereafter in the inner region, the contact spots of the semi-conductor are welded on the aluminized conductive paths of the intermediate substrate and the external ends of the conductive paths are superposed by welding in a further process on the circuit substrate which is manufactured similarly to Example I.

EXAMPLE V

The entire surface of the ceramic substrate is chemically copper-plated with the layer of 5 μm as in Example I. Then a polyamide photo-varnish is sprayed on the substrate and the latter after drying-up is exposed via a photomask. After the development the connection surfaces and conductive paths are released with the exception of solder connection spots. At a prescribed temperature range or profile the varnish is completely changed over, under the action of the protective gas into the polyamide. Then a semi-additive deposition of 5 μm layer of aluminum onto the exposed copper takes place. Then the polyamide which serves as a galvano-resist is alkalically removed.

A further photoresist coating covers all the conductive paths, connection pads and also solder pads so that, after the developing process the surepfluous copper layer can be etched away.

EXAMPLE VI

The following method is executed without the use of the polyamide as a galvano-resist and without a specific structuring of galvanic aluminum.

The entire surface of a ceramic substrate is copper-pleated as in Example I and is structured in the known fashion by a photo-screening process. The insulated conductive trains are connected to each other by short-circuit connections so that with the galvanic aluminizing all the copper structures are coated also at their lateral flanks. Finally, the short-circuit connections are again separated by a laser.

It will be understood that each of the elements described above, or two or more together, may also find a useful application in other types of methods for producing contacts of integrated circuits from galvanically deposited aluminum layers differing from the types described above.

While the invention has been illustrated and described as embodied in a method of producing contacts of integrated circuits from galvanically deposited aluminum layers, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In a method of producing contacts of microcircuits, of the type wherein a conductive metal layer is provided on a silicon substrate, said conductive metal layer is passivated outside contact spots, and aluminum is deposited only on selected portions of said conductive metal layer, said portions acting as contacts for said conductive metal layer, the improvement comprising the steps of producing said conductive metal layer on said circuit substrate by chemical metallization, evaporation or cathodic decomposition, then passivating said conductive metal layer outside contact spots and galvanically reinforcing said contact spots with aluminum.

2. In a method of producing contacts of microcircuits of the type wherein a conductive metal layer is provided on a substrate and aluminum is deposited only on selected portions of said conductive metal layer to act a contacts for said conductive metal layer, the improvement comprising the steps of producing said conductive metal layer on said circuit substrate by chemical metallization, then applying onto said substrate and conductive metal layer a photo-structured polyamide layer, except at solder connection portions, and then depositing aluminum only on said connection pads and at places where a solderless layer on conductive paths is desired.

3. The method according to claim 2, wherein said step of applying onto said substrate and conductive metal layer a photo-structured polyamide layer comprises spraying onto said substrate and conductive metal layer a polyamide photo varnish, applying a photomask except at solder connection portions, allowing said varnish to change over into polyamide, under the action of protective gas, and further comprising after depositing aluminum, removing said polyamide layer by means of alkali.

4. In a method of producing contacts of microcircuits, of the type wherein a conductive metal layer is provided on a substrate and aluminum is deposited only on selected portions of said conductive metal layer to act as contacts for said conductive metal layer, the improvement comprising the steps of producing said conductive metal layer on said circuit substrate by chemical metallization, evaporation or cathodic decomposition, then galvanically depositing on said conductive meal layer an aluminum layer, coating said aluminum layer with an etch resist, and etching said aluminum layer, and further providing an intermediate substrate with a galvanically deposited aluminum layer, and then etching the same.

5. The method according to claim 1, further comprising providing an intermediate substrate with a galvanically deposited aluminum layer, and then etching the same.

* * * * *